(12) United States Patent
Seong et al.

(10) Patent No.: US 11,961,750 B2
(45) Date of Patent: Apr. 16, 2024

(54) MAGNETIC TRANSFER APPARATUS AND FABRICATION METHOD OF THE SAME

(71) Applicant: KOREA UNIVERSITY RESEARCH AND BUSINESS FOUNDATION, Seoul (KR)

(72) Inventors: Tae-Yeon Seong, Seoul (KR); Da-Hoon Lee, Seoul (KR); Jong-Ho Kim, Pyeongtaek-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 275 days.

(21) Appl. No.: 17/536,831

(22) Filed: Nov. 29, 2021

(65) Prior Publication Data
US 2022/0246458 A1 Aug. 4, 2022

(30) Foreign Application Priority Data
Jan. 29, 2021 (KR) .......................... 10-2021-0012966

(51) Int. Cl.
*H01L 21/677* (2006.01)
*B65G 54/02* (2006.01)

(52) U.S. Cl.
CPC .. *H01L 21/67709* (2013.01); *H01L 21/67715* (2013.01); *H01L 21/67721* (2013.01); *B65G 54/02* (2013.01)

(58) Field of Classification Search
CPC ......... H01L 21/67709; H01L 21/67715; H01L 21/67721; B65G 54/02
See application file for complete search history.

(56) References Cited

U.S. PATENT DOCUMENTS 9,607,907 B2 3/2017 Wu et al.
2003/0201862 A1* 10/2003 Arntz .................... B60M 7/003
336/174
2011/0151588 A1 6/2011 Ashdown et al.
(Continued)

FOREIGN PATENT DOCUMENTS

JP 8-12076 * 1/1996 ............ B65G 54/02
KR 10-2017-0113019 A 10/2017
(Continued)

OTHER PUBLICATIONS

Korean Notice of Allowance dated Feb. 2, 2023, in connection with the Korean Patent Application No. 10-2021-0012966 with its English translation (2 pages).

*Primary Examiner* — James R Bidwell
(74) *Attorney, Agent, or Firm* — Hauptman Ham, LLP

(57) ABSTRACT

A magnetic transfer apparatus includes: a magnetomotive force source providing magnetic flux, a first magnetic flux distribution circuit connected to one end of the magnetomotive force source, having a single input terminal and a plurality of output terminals, and distributing the magnetic flux, and a second magnetic flux distribution circuit connected to the other end of the magnetomotive force source, having a single output terminal and a plurality of input terminals, and collecting the distributed magnetic flux. The output terminals of the first magnetic flux distribution circuit are disposed to be adjacent to each other to form a pair with the input terminals of the second magnetic flux distribution circuit.

7 Claims, 16 Drawing Sheets

(56) References Cited

U.S. PATENT DOCUMENTS

| | | | | |
|---|---|---|---|---|
| 2013/0084157 | A1* | 4/2013 | Staunton | B65G 47/91 |
| | | | | 414/752.1 |
| 2016/0172253 | A1* | 6/2016 | Wu | G01R 31/2635 |
| | | | | 335/291 |
| 2017/0148650 | A1* | 5/2017 | Wu | H01L 22/22 |
| 2020/0083069 | A1* | 3/2020 | Hussein | H01L 33/62 |
| 2021/0191283 | A1* | 6/2021 | Lee | H01L 21/67721 |
| 2021/0249943 | A1* | 8/2021 | Yamamoto | C23C 14/568 |
| 2022/0246458 | A1* | 8/2022 | Seong | H01L 21/67721 |
| 2022/0336134 | A1* | 10/2022 | Hussein | H01L 21/67144 |

FOREIGN PATENT DOCUMENTS

| | | | | |
|---|---|---|---|---|
| KR | 20170113019 | A * | 10/2017 | ....... H01L 21/67709 |
| KR | 10-2017-0124282 | A | 11/2017 | |
| KR | 10-1874199 | B1 | 7/2018 | |
| KR | 10-2018-0086945 | A | 8/2018 | |
| KR | 10-2019-0091072 | A | 8/2019 | |
| KR | 10-2019-0127418 | A | 11/2019 | |
| KR | 10-2127559 | B1 | 6/2020 | |
| WO | 2020/093800 | A1 | 5/2020 | |

\* cited by examiner

MAGNETIC TRANSFER APPARATUS AND FABRICATION METHOD OF THE SAME

CROSS-REFERENCE TO RELATED APPLICATIONS

This U.S. non-provisional patent application claims priority under 35 U.S.C. § 119 to Korean Patent Application No. 10-2021-0012966, filed on Jan. 29, 2021, in the Korean Intellectual Property Office, the entire contents of which are hereby incorporated by reference.

TECHNICAL FIELD

The present disclosure relates to a transfer apparatus of a semiconductor light emitting magnetic transfer apparatus and, more particularly, a magnetic transfer apparatus for micro-LED transfer.

BACKGROUND

In general, a semiconductor device may be manufactured through various processes. For example, a device may be formed, and a dicing process, an inspection process, a die bonding process, a packaging process, and the like, may then be sequentially performed to complete a desired semiconductor device. To perform the above-mentioned processes, the device needs to be transferred. The transfer of the device may be performed using a pick-and-place device.

In general, a pick-and-place device may pick up a device by vacuum-adsorbing the device. After moving the device while picking up the device, the pick-and-place device may release a vacuum state to place the device in a target point. In addition, the device may be directly picked up using pickup tongs, or the like. However, in the case of a micro light emitting diode (micro-LED), it may difficult to pick up a device thereof because the device is small and thin, and the device may be damaged by the pressure generated by the vacuum chuck.

It may be difficult to pick up devices having various sizes using a typical device pickup method, and there may be be a limitation in size of devices which can be used.

Micro-LED displays have come into spotlight as high-resolution displays. A micro-LED display may have a structure in which R/G/B LED devices are arranged on a substrate. Each of the LED devices may have a size of several micrometers to several tens of micrometers.

An LED device, having a size of several micrometers to several hundred micrometers, may be transferred and attached to a flexible substrate to provide a foldable or bendable micro-LED display. However, it may be difficult to transfer a miniaturized LED device from a growth substrate to a target substrate using an existing pick-and-place device. Accordingly, there is a need for a high-precision component transportation device or transfer device which may transfer a miniaturized LED device.

LED devices need to be arranged on a printed circuit board to correspond to a pixel pitch, but the pixel pitch is unrelated to an arrangement pitch of the devices when the devices are formed. Accordingly, there is a need for a technology to rearrange LED devices.

In Korean Patent Registration No. 10-2127559B1, magnetic nanoparticles are dispersed in a photoresist to form a magnetic alignment axis. Use of such a method results in the advantage that a magnetic field may pass through only a region, in which magnetic nanoparticles are vertically aligned, and may be reflected in a region magnetic nanoparticles are horizontally aligned. However, as set forth in U.S. Patent Publication No. 2011/0151588A1, the above technology has several issues. First, gas bubbles are formed after magnetic nanoparticles are dispersed in a photoresist and a waiting time of 12 hours is required to remove the gas bubbles. Second, the magnetic particles should be used within 48 hours because they may agglomerate. Therefore, the magnetic particles may not be used permanently.

In Korean Patent Application No. 10-2016-0053975, magnetic properties are induced using a coil after patterning a magnetic material, but it may be difficult to perform a coil forming process on a plurality of heads.

A micro-electromechanical system (MEMS)-based coil may be formed as in U.S. Pat. No. 9,607,907B2, but a plurality of semiconductor processes are required. Accordingly, there is a need for a technology which may configure a magnetic transfer apparatus while significantly decreasing a size of a coil.

In U.S. Patent Publication No. 2020/0083069A1, a magnetic transfer apparatus may be manufactured through a simple process by patterning a magnetic material. In such a magnetic circuit connected in series, it may be difficult to suck a plurality of LED chips with uniform magnetic force because magnetic flux varies depending on a position of the magnetic circuit.

A micro-LED display requires an LED pixel of 100 um or less. A micro-LED chip of 5 μm or less is required to implement a high-resolution micro-display (augmented reality (AR) or virtual reality (VR)) of 1,000 pixels per inch (PPI) or more. Therefore, a head of a magnetic transfer apparatus should be designed to transfer such microchips. Accordingly, it is significantly difficult to generate form an electromagnet generating magnetomotive force of less than 100 um.

To implement a micro-LED display, an LED grown on a sapphire substrate or a gallium-arsenic (GaAs) substrate should be transferred to a target substrate. In a current LED manufacturing process, yield is not 100% and non-operating LEDs should not be transferred to a display substrate. Accordingly, there may be a need for a technology to evaluate electrical characteristics (ideality factor, I-V curve, and breakdown voltage) and optical characteristics (EL measurement, wavelength measurement, and S-parameter) and to transfer only a specific LED to a display substrate.

In general, after an LED is grown, a wavelength, or the like, may be inspected using photoluminescence (PL) to determine whether the LED is well grown. However, an electroluminescence (EL) test may be required. This is because the display is actually implemented in an EL manner. It is also taken into consideration that the LED includes a group III-V compound, an energy band is bent due to a quantum confinement stark effect (QCSE) caused by strain as each layer is grown, and a wavelength is shifted as current is applied. That is, the wavelength may vary depending on the current applied when a display is implemented. In general, blue-shift may occur in a low-current section due to a band-filling effect, and red-shift may occur in a high-current section due to heat. Therefore, an inspection of EL characteristics may be more important. Although current or a voltage may be adjusted in a backplane, but ranges thereof may be limited. Accordingly, a defective LED is necessarily repaired.

In addition, a process, so-called MESA, may be performed in a process of manufacturing a micro-LED. However, sidewall damage may cause an increase in Shockley-Read-Hall (SRH) recombination and a decrease in efficiency. Moreover, since a size is small, there may be a high probability that a process issue occurs. In addition, since an area of a sidewall is increased as compared with a surface, leakage current may be increased. Due to a small chip size, there are many issues in chip production as well as in a transfer process.

When a grown LED is directly transferred to a backplane (CMOS, HEMT, or an oxide TFT), an issue may occur for the above-described reasons. When a malfunctioning chip is transferred to the backplane using a bonding material (a eutectic bonding material, an anisotropic conductive film (ACF), or an anisotropic conductive paste (ACP)), it may be difficult to perform a repair process.

If calculated simply, when a micro-LED display having a resolution of 4K is manufactured, about 25 million LEDs are required. In addition, when transfer and repair processes are added, costs may be further added. Accordingly, there may be a need for a method of selecting and transferring only normally operating chips.

SUMMARY

An aspect of the present disclosure is to pick up a plurality of LED devices by distributing magnetic flux through a first magnetic flux distribution circuit and a second magnetic flux distribution circuit using a single magnetomotive force source such that respective branches provide the same magnetic suction force. The magnetomotive source, the first magnetic flux distribution circuit, and the second magnetic flux distribution circuit may constitute a closed magnetic circuit.

Another aspect of the present disclosure is to pick up a plurality of LED devices by providing uniform magnetomotive force to magnetic circuits, each constituting a closed circuit, using a single magnetomotive force source such that the same suction force is provided.

A magnetic transfer apparatus according to an example embodiment includes: a magnetomotive force source providing magnetic flux; a first magnetic flux distribution circuit connected to one end of the magnetomotive force source, having a single input terminal and a plurality of output terminals, and distributing the magnetic flux; and a second magnetic flux distribution circuit connected to the other end of the magnetomotive force source, having a single output terminal and a plurality of input terminals, and collecting the distributed magnetic flux. The output terminals of the first magnetic flux distribution circuit are disposed to be adjacent to each other to form a pair with the input terminals of the second magnetic flux distribution circuit.

In an example embodiment, a magnetic layer of an LED device may be disposed between the output terminal of the first magnetic flux distribution circuit and the input terminal of the second magnetic flux distribution circuit forming a pair with each other. The magnetomotive force source, the first magnetic flux distribution circuit, and the second magnetic flux distribution circuit may constitute a closed magnetic circuit.

In an example embodiment, the first magnetic flux distribution circuit may have a binary tree structure such that magnetic paths between the input terminal of the first magnetic flux distribution circuit and the plurality of output terminals of the first magnetic flux distribution circuit have the same magnetic resistance. The second magnetic flux distribution circuit may have a binary tree structure such that magnetic paths between the plurality of input terminals of the second magnetic flux distribution circuit and the output terminal of the second magnetic flux distribution circuit have the same magnetic resistance.

In an example embodiment, the first magnetic flux distribution circuit and the second magnetic flux distribution circuit may include: a substrate; a first non-magnetic layer disposed on the substrate; a second non-magnetic layer disposed on the first non-magnetic layer; first magnetic vias penetrating through the substrate; second magnetic vias penetrating through the substrate and the first non-magnetic layer; a first magnetic flux distribution pattern disposed on the substrate and connecting the first magnetic vias to each other; a second magnetic flux distribution pattern disposed on the first non-magnetic layer and connecting the second magnetic vias to each other; a first magnetic contact plug disposed to penetrate through the first non-magnetic layer and the second non-magnetic layer and magnetically connected to the first magnetic flux distribution pattern; and a second magnetic contact plug disposed to penetrate through the second non-magnetic layer and magnetically connected to the second magnetic flux distribution pattern. The first magnetic vias and the second magnetic vias are disposed adjacent to each other to form a pair, the first magnetic contact plug may be connected to one end of the magnetomotive force source, the second magnetic contact plug may be connected to the other end of the magnetomotive force source, the input terminal of the first magnetic flux distribution circuit nay correspond to the first magnetic contact plug, the output terminals of the first magnetic flux distribution circuit may correspond to the first magnetic vias, the output terminal of the second magnetic flux distribution circuit may correspond to the second magnetic contact plug, and the input terminals of the second magnetic flux distribution circuit may correspond to the second magnetic vias.

In an example embodiment, the magnetomotive force source may include: a coil providing magnetic flux to the first magnetic flux distribution circuit and the second magnetic flux distribution circuit; and a magnetic core confining magnetic flux generated by the coil.

In an example embodiment, the magnetomotive force source may include: a first magnetic core having a tapered shape to provide the magnetic flux to the first contact plug; a second magnetic core having a tapered shape to provide the magnetic flux to the second contact plug; a third magnetic core connecting the first magnetic core and the second magnetic core to each other; and a coil disposed to surround at least one of the first to third magnetic cores.

A fabrication method of a magnetic transfer apparatus according to an example embodiment includes: forming a magnetic layer on a lower surface of a substrate; forming first via holes in the substrate and filling the first via holes with a magnetic material to form first magnetic vias; forming a first magnetic flux distribution pattern, connected to the first magnetic vias, on the substrate; stacking a first non-magnetic layer on the substrate, on which the first magnetic flux distribution pattern is formed, and forming a second via hole to penetrate through the first non-magnetic layer and the substrate, and then filling the second via hole with a magnetic material to form second magnetic vias; and forming a second magnetic flux distribution pattern on the substrate on which the second magnetic vias are formed.

In an example embodiment, each of the first magnetic flux distribution pattern and the second magnetic flux distribution pattern may include a plurality of branches, and the plurality of branches may have the same length.

In an example embodiment, the fabrication method may further include: forming a second non-magnetic layer on the substrate on which the second magnetic flux distribution pattern is formed; forming a first magnetic contact plug penetrating through the first non-magnetic layer and the second non-magnetic layer and connected to the first magnetic flux distribution pattern; and forming a second magnetic contact plug penetrating through the second non-magnetic layer and connected to the second magnetic flux distribution pattern.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1A:
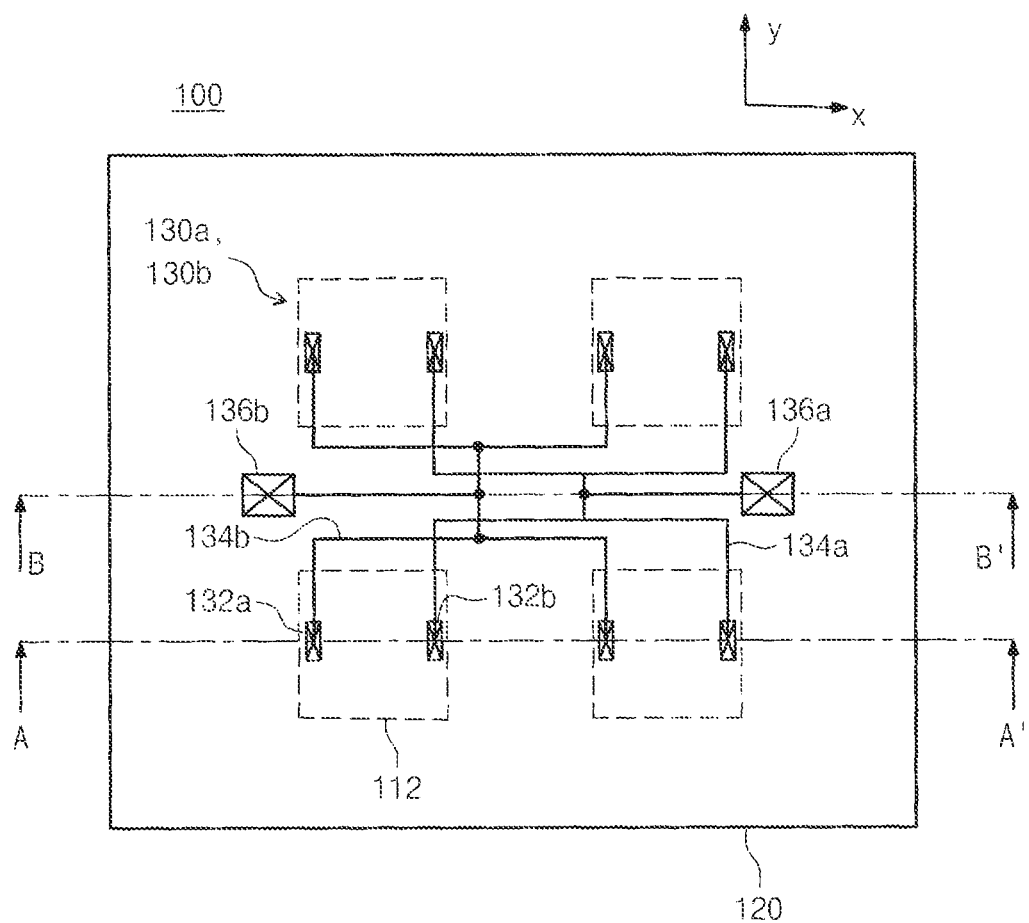
FIG. 1A is a plan view illustrating an element electronic device according to an example embodiment of the present disclosure.

A magnetic circuit is a circuit representing a flow of magnetic flux. When one component constituting the magnetic circuit is spaced apart from the magnetic circuit, suction magnetic force may be generated such that stored magnetic energy or magnetic flux is maintained to be constant. The suction magnetic force may lift the one component, constituting the magnetic circuit, from a magnetic material against gravity. The suction magnetic force may be in proportion to a square of magnetic flux density and may be in inverse proportion to an area. Therefore, a high flux density (or magnetic field) is required to apply large suction magnetic force. The magnetic flux density is in proportion to a magnitude of current and the number of turns of a coil. However, since a micro-LED device has a size of one hundred um or less, a magnetic transfer apparatus may be limited in increasing the magnitude of the current and increasing the number of the turns of the coil.

A magnetic transportation device or a magnetic transfer apparatus, capable of simultaneously transferring a plurality of miniaturized LED devices, is required. The magnetic transportation device may include a magnetic material constituting a magnetic circuit. A transported object may be coated with a magnetic layer to constitute a magnetic circuit. The magnetic transfer apparatus may allow magnetic flux to be applied to the magnetic circuit at a predetermined time by an electromagnet.

A single magnetic circuit and a single electromagnet may be used to transfer a plurality of LED devices. However, since coil-structure inductance is required for an electromagnet, the electromagnet is required to have a large volume. Therefore, a significantly large volume is required to pick up a micrometer-sized LED device. An example embodiment proposes a device which may pick up a plurality of LED devices with the same magnetic suction force while constituting a closed magnetic circuit through a magnetic flux distribution circuit using a single electromagnet. A current circuit and the magnetic circuit may have a mutual correspondence relationship, and resistance of the current circuit may correspond to magnetic resistance in the magnetic circuit. When magnetic flux flows through the magnetic circuit, branched magnetic circuits may have different magnetic fluxes due to different magnetic resistances. The present disclosure proposes a magnetic flux distribution circuit structure in which branched magnetic circuits have the same magnetic resistance.

According to an example embodiment, a magnetomotive force source may generate magnetic flux and may provide the generated magnetic flux to a first magnetic flux distribution circuit. The first magnetic flux distribution circuit may have a single input terminal and a plurality of output terminals, and may be uniformly distributes magnetic flux to a plurality of magnetic paths. The uniformly distributed magnetic flux may be collected through a second magnetic flux distribution circuit via a magnetic layer disposed on an LED chip. The second magnetic flux distribution circuit may have a plurality of input terminals and a single output terminal. Magnetic flux, incident on the plurality of input terminals, may be collected into the single output terminal. The magnetomotive force source may inject magnetic flux into the input terminal of the first magnetic flux distribution circuit, and may constitute a closed magnetic circuit through the output terminal of the second magnetic flux distribution circuit. Accordingly, each LED may be adsorbed and transported by the same magnetic suction force. To uniformly distribute the magnetic flux, each branch of the first magnetic flux distribution circuit may have the same magnetic resistance and each branch of the second magnetic flux distribution circuit may have the same magnetic resistance. Magnetic resistance is in proportion to a length of a circuit and is in inverse proportion to a cross-sectional area and permeability. Accordingly, each branch may be designed to have the same cross-sectional area and may be designed to have the same length. As a result, each branch may have the same magnetic resistance.

A pick-and-place device according to an example embodiment may include a magnetomotive force source providing magnetomotive force, a first magnetic circuit connected to one end of the magnetomotive force source and having a plurality of branches, and a second magnetic circuit connected to the other end of the magnetomotive source and having a plurality of branches. Terminals of the branches of the first magnetic circuit may be disposed to be adjacent to terminals of the branches of the second magnetic circuit.

According to an example embodiment, a magnetic material constituting a magnetic circuit may include a ferromagnetic material. The ferromagnetic material may be iron, nickel, cobalt, manganese, molybdenum, or alloys thereof. A material, constituting the magnetic circuit, may be coated with an insulating material on ferromagnetic powder. Accordingly, energy loss caused by eddy currents generated by a time-varying magnetic field may be reduced.

Hereinafter, embodiments of the present disclosure will be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

FIG. 1A is a plan view illustrating an element electronic device according to an example embodiment of the present disclosure.

Figure 1B:
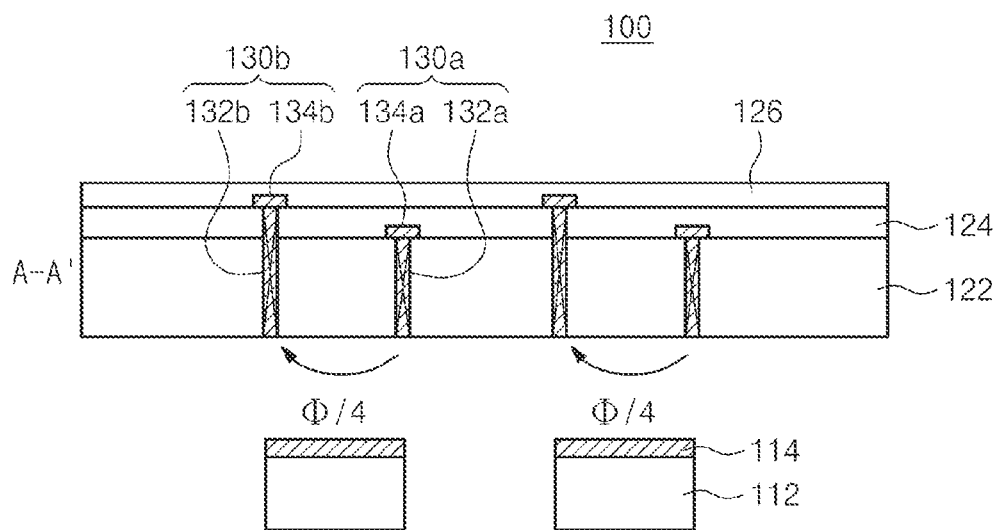
FIG. 1B is a cross-sectional view take along line A-A' of FIG. 1A.

FIG. 1B is a cross-sectional view take along line A-A' of FIG. 1A.

Figure 1C:
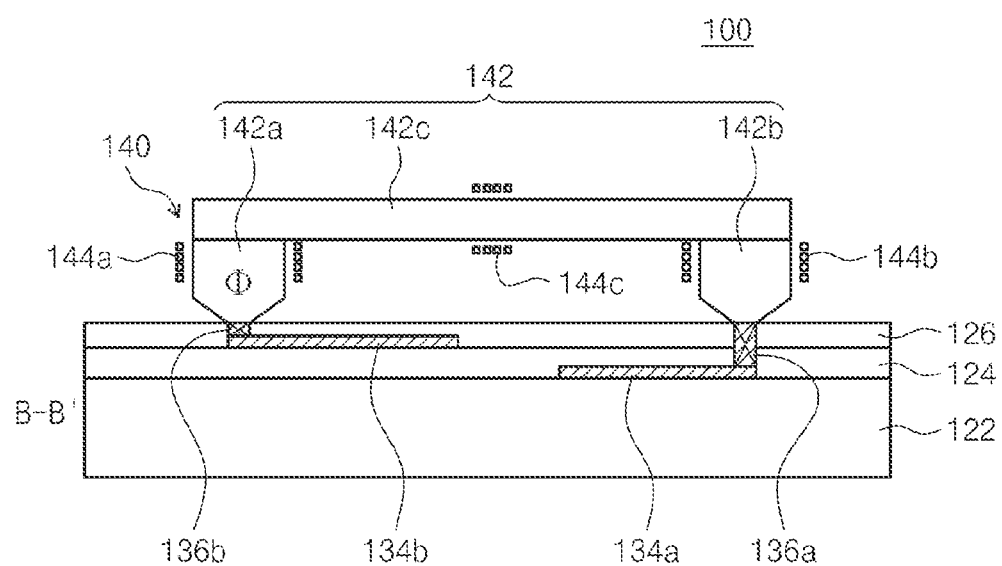
FIG. 1C is a cross-sectional view taken along line B-B' of FIG. 1B.

FIG. 1C is a cross-sectional view taken along line B-B' of FIG. 1B.

Figure 1D:
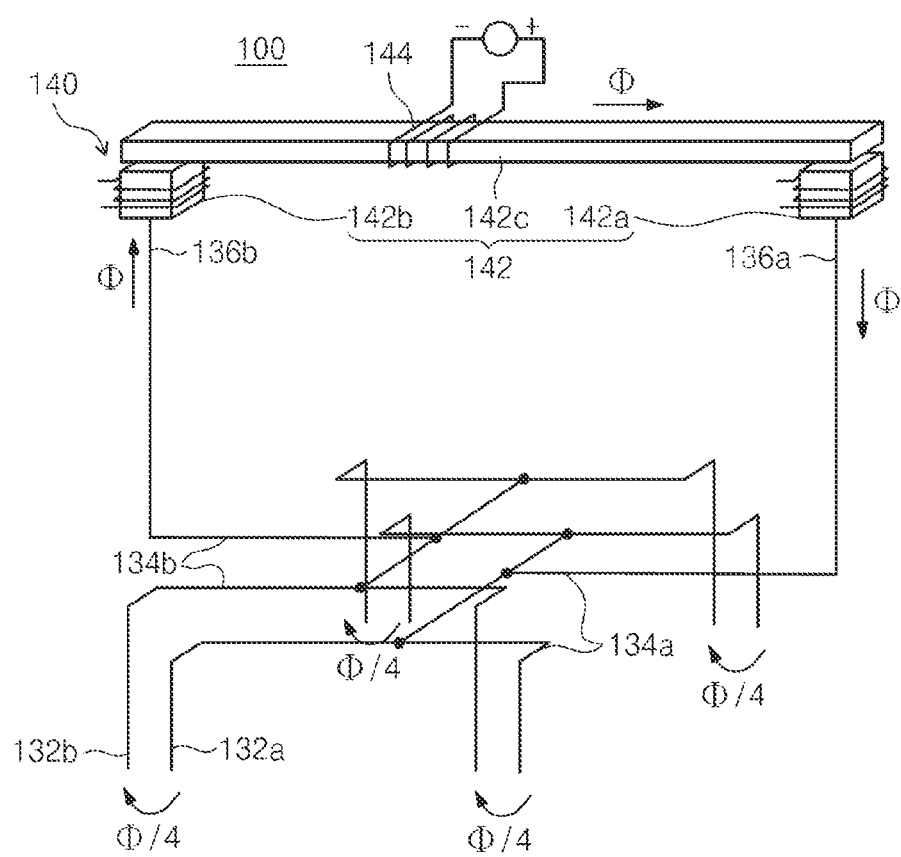
FIG. 1D is a conceptual diagram illustrating a magnetic transfer apparatus of FIG. 1A.

FIG. 1D is a conceptual diagram illustrating a magnetic transfer apparatus of FIG. 1A.

Figure 1E:
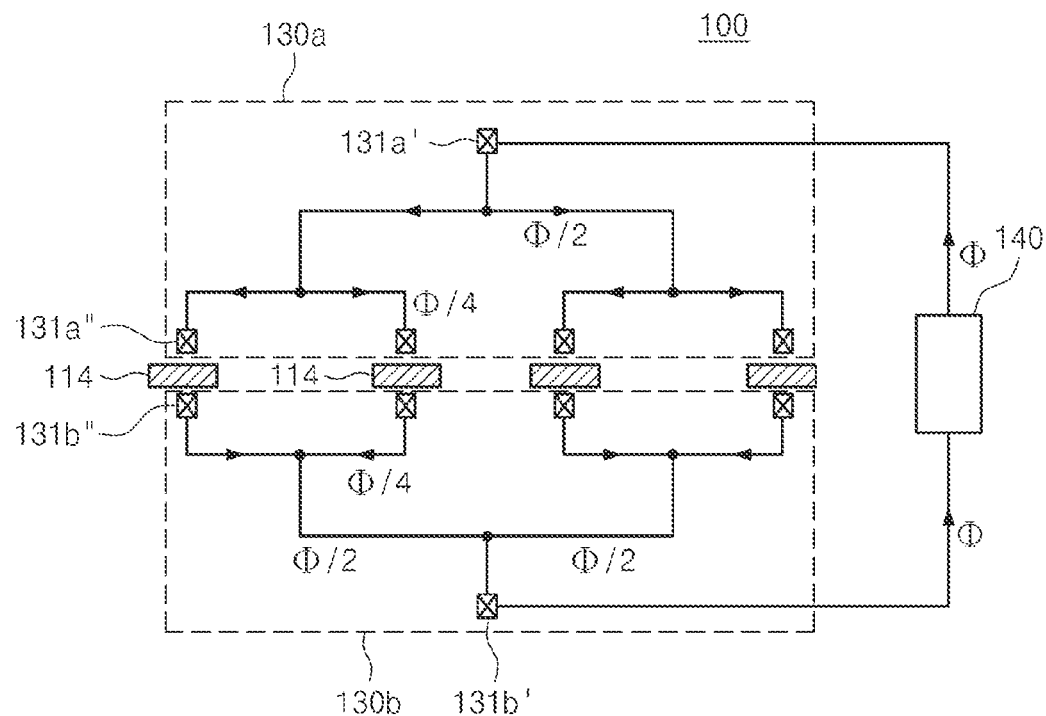
FIGS. 1E to 1F are magnetic circuit diagram illustrating the element electronic device of FIG. 1A.
Figure 1F:
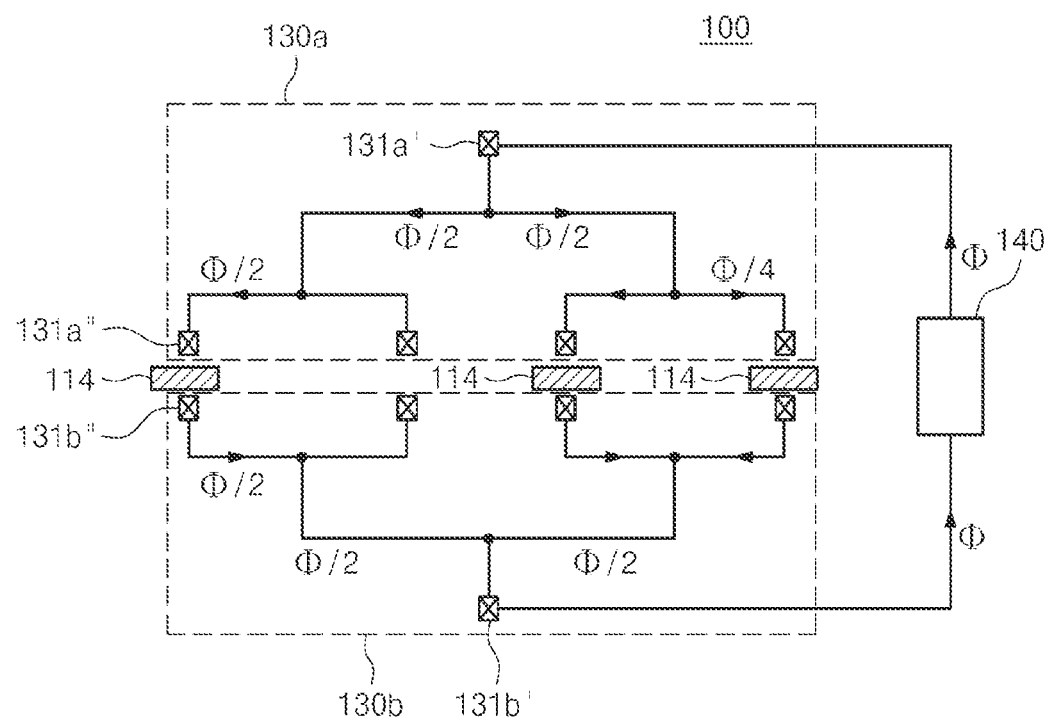

FIGS. 1E to 1F are magnetic circuit diagram illustrating the element electronic device of FIG. 1A.

Referring to FIGS. 1A to 1E, a magnetic transfer apparatus 100 according to an example embodiment may include a magnetomotive force source 140 providing magnetic flux Φ, a first magnetic flux distribution circuit 130a connected to one end of the magnetomotive force source 140, having a single input terminal 131a' and a plurality of output terminals 131a", and distributing the magnetic flux and a second magnetic flux distribution circuit 130b connected to the other end of the magnetomotive force source 140, having a single output terminal 131b' and a plurality of input terminals 131b", and collecting the distributed magnetic flux Φ. The output terminals 131a" of the first magnetic flux distribution circuit 130a may be disposed to be adjacent to each other to form a pair with the input terminals 130b" of the second magnetic flux distribution circuit 130b. A distance between the output terminals 131a" of the first magnetic flux distribution circuit 130a and the input terminals 130b" of the second magnetic flux distribution circuit 130b, forming a pair with each other, may be smaller than a size of an LED device.

The LED device may be separated in units of chips after LED devices are manufactured on a growth substrate. Alternatively, LED devices may be manufactured on an LED wafer and bonded to a separate carrier substrate, and may then be separated from each other. The separated LED devices may be picked up by a magnetic electronic device (or a pickup head), and may then be transferred to a backplane or a printed circuit board.

Alternatively, LED characteristics (electro-optic efficiency) of chips grown and manufactured on a wafer are different from each other. When such chips are directly transferred to a backplane or a printed circuit board, efficiency of the chips may vary, resulting in an issue in implementing the chips as a display. Accordingly, methods of collecting chips having similar characteristics and transferring the collected chips to a printed circuit board or a backplane, based on the concept of an interposer introduced into a used technology, may be used.

The magnetic electronic device 100 may transfer a plurality of LED devices to a printed circuit board or a backplane at the same time. The backplane may include a thin film transistor.

To transfer the LED devices 112 using the magnetic suction force, each of the LED devices may be coated with a magnetic layer 114 on a surface thereof. The magnetic layer 114 may be easily removed later.

The magnetic layer 114 of the LED device may be applied using magnetic ink. When a transfer process is performed by coating thermal release tape on a surface of the LED device and applying a magnetic ink to the surface of the LED device and then heat is applied, the thermal release tape may lose adhesive force thereof, so that the magnetic ink may be easily removed. Since the magnetic ink contains a magnetic material such as iron (Fe), nickel (Ni), cobalt (Co), a perm-alloy, or the like, the magnetic ink may include viscous liquid which may react with a magnetic field.

The output terminals 131a" of the first magnetic flux distribution circuit 130a may be disposed to be adjacent to each other to form a pair with the input terminals 130b" of the second magnetic flux distribution circuit 130b. The magnetic layer 114 of the LED device may be disposed between the output terminal 131a" of the first magnetic flux distribution circuit 130a and the input terminal 131b" of the second magnetic flux distribution circuit 130b forming a pair with each other. Accordingly, the magnetomotive force source 140, the first magnetic flux distribution circuit 130a, and the second magnetic flux distribution circuit 130b may constitute a closed magnetic circuit.

The first magnetic flux distribution circuit 130a may have a binary tree structure such that magnetic paths between the input terminal 131a' of the first magnetic flux distribution circuit 130a and a plurality of output terminals 131a" of the first magnetic flux distribution circuit 130a have the same magnetic resistance. That is, the first magnetic flux distribution circuit 130a may be configured to have a plurality of branches having the same magnetic resistance. That is, the magnetic resistance may be in proportion to a length of the magnetic path and may be in inverse proportional to a cross-sectional area. When the cross-sectional area is the same, the magnetic paths may be the same. The magnetic path may have, in detail, a binary tree structure.

The second magnetic flux distribution circuit 130b may have a binary tree structure such that magnetic paths between the plurality of input terminals 131b" and an output terminal 131b' of the second magnetic flux distribution circuit have the same magnetic resistance. A unit binary tree structure, having two branches, may be arranged in relative symmetry or bilateral symmetry. Accordingly, when there are four adsorption cells, a 2-by-2 array or a 4-by-1 array may be formed.

When there are eight adsorption cells, a 2-by-4 array or an 8-by-1 array may be formed. When there are 16 adsorption cells, a 4-by-4 array, a 16-by-1 array, an 8-by-2 array, or the like, may be formed.

When the magnetic resistance is the same for each magnetic path, the magnetic flux provided to the first magnetic flux distribution circuit 130a may be uniformly distributed for each magnetic path (or branch). Accordingly, the LED devices may be adsorbed with the same magnetic suction force. In addition, a binary tree structure may be designed as a multiple of two, so that a plurality of LED devices may be simultaneously transferred.

For example, in the case in which a first magnetic flux distribution circuit having a 4-by-4 array is provided, when a size of a single LED device is 100 µm, a total length of the first magnetic flux distribution circuit may be 100×8 times. Accordingly, as the first magnetic flux distribution circuit secures a sufficient distance, an electromagnet in which a coil is wound around a magnetic core may be used as the magnetomotive force source 140. Thus, the magnetomotive force source may provide magnetic flux to the first magnetic flux distribution circuit without leakage of magnetic flux to efficiently transfer magnetic energy.

The first magnetic flux distribution circuit 130*a* and the second magnetic flux distribution circuit 130*b* may be manufactured through a PCB process or a semiconductor process.

The first magnetic flux distribution circuit 130*a* may branch incident magnetic flux and provides the branched magnetic flux to each of the LED devices. The second magnetic flux distribution circuit 130*b* may collect magnetic fluxes, passing through the LED devices, and may transfer the collected magnetic fluxes to the magnetomotive force source 140. Accordingly, leakage flux may be significantly reduced to efficiently and simultaneously pick up the LED devices.

Specifically, the first magnetic flux distribution circuit 130*a* and the second magnetic flux distribution circuit 130*b* may include: a substrate 122, a first non-magnetic layer 124 disposed on the substrate 122, a second non-magnetic layer 126 disposed on the first non-magnetic layer 124, first magnetic vias 132*a* penetrating through the substrate 122, second magnetic vias 132*b* penetrating through the substrate 122 and the first non-magnetic layer 124, a first magnetic flux distribution pattern 134*a* disposed on the substrate 122 and connecting the first magnetic vias 132*a* to each other, a second magnetic flux distribution pattern 134*b* disposed on the first non-magnetic layer 124 and connecting the second magnetic vias 132*b* to each other, a first magnetic contact plug 136*a* disposed to penetrate through the first non-magnetic layer 124 and the second non-magnetic layer 126 and magnetically connected to the first magnetic flux distribution pattern 134*a*, and a second magnetic contact plug 136*b* disposed to penetrate through the second non-magnetic layer 126 and magnetically connected to the second magnetic flux distribution pattern 134*b*. The first magnetic vias 132*a* and the second magnetic vias 132*b* may be disposed adjacent to each other to form a pair. The first magnetic contact plug 136*a* may be connected to one end of the magnetomotive force source 140. The second magnetic contact plug 136*b* may be connected to the other end of the magnetomotive force source 140. The input terminal 131*a'* of the first magnetic flux distribution circuit 130*a* may correspond to the first magnetic contact plug 136*b*. The output terminals 131*a"* of the first magnetic flux distribution circuit 130*a* may correspond to the first magnetic vias 132*a*. The output terminal 131*b'* of the second magnetic flux distribution circuit 130*b* may correspond to the second magnetic contact plug 136*b*. The input terminals 131*b"* of the second magnetic flux distribution circuit 130*b* may correspond to the second magnetic vias 132*b*.

The substrate 122 may include a non-magnetic material and may be a semiconductor substrate, a PCB substrate, a plastic substrate, or a non-magnetic metal substrate. The substrate 122 may be a rigid substrate having no flexibility. A thickness of the substrate 122 may be several tens of um to several millimeters. The substrate 122 may include, in detail, an insulating material.

The first non-magnetic layer 124 may include an insulating material or a non-magnetic conductive material. The first non-magnetic layer 124 may include, in detail, an insulating material. The second non-magnetic layer 126 may include an insulating material or a non-magnetic conductive material. The second non-magnetic layer 126 may include, in detail, an insulating material.

The first magnetic vias 132*a* may be terminals for transferring the distributed magnetic flux to the magnetic layer 114 of the LED device. The first magnetic vias 132*a* may be disposed to penetrate through the substrate 122 and may be disposed for each LED device to be adsorbed. All magnetic materials, constituting a magnetic circuit, may be the same material.

The second magnetic vias 132*b* may focus the distributed magnetic flux transmitted through the magnetic layer 114 of the LED device. The second magnetic vias 132*b* may be disposed to penetrate through the substrate 122 and the first non-magnetic layer 124, and may be disposed for each LED device to be adsorbed. A height of the first magnetic via 132*a* and a height of the second magnetic via 132*b* may be different from each other. Accordingly, the first magnetic flux distribution pattern 134*a* connected to the first magnetic via 132*a* and the second magnetic flux distribution pattern 134 connected to the second magnetic via 132*b* may be disposed on different planes on which they are disposed, so that they do not overlap each other on the same plane.

The first magnetic flux distribution pattern 134*a* may have a binary tree structure, and may connect the first magnetic vias 132*a* to each other. Therefore, in the first magnetic flux distribution pattern 134*a*, all distances between one input terminal and a plurality of output terminals may be the same. Accordingly, magnetic resistance may be the same for each magnetic path, so that the distributed magnetic fluxes may be the same.

The second magnetic flux distribution pattern 134*b* may have a binary tree structure, and may connect the second magnetic vias 132*b* to each other. Therefore, in the second magnetic flux distribution pattern 134*b*, all distances between the plurality of input terminals and one output terminal may be the same. Accordingly, magnetic resistance may be the same for each magnetic path, so that the distributed magnetic fluxes may be the same. The plane, on which the first magnetic flux distribution pattern 134*a* is disposed, may be different from the plane on which the second magnetic flux distribution pattern 134*b* is disposed. Accordingly, the first magnetic flux distribution pattern 134*a* and the second magnetic flux distribution pattern 134*b* may not overlap each other on the same plane.

The first magnetic contact plug 136*a* may be disposed to penetrate through the first non-magnetic layer 124 and the second non-magnetic layer 126. One end of the first magnetic contact plug 136*a* may be connected to the first magnetic flux distribution pattern 134*a*, and the other end of the first magnetic contact plug 136*a* may be exposed to an external entity. The other end of the first magnetic contact plug 136*a* may receive magnetic flux from an external magnetomotive force source 140.

The second magnetic contact plug 136*b* may be disposed to penetrate through the second non-magnetic layer 126. One end of the second magnetic contact plug 136*b* may be connected to the second magnetic flux distribution pattern 134*b*, and the other end of the second magnetic contact plug 136*b* may be exposed to an external entity. The second magnetic contact plug 136*b* may transmit magnetic flux to the external magnetomotive force source 140.

For example, when the first magnetic flux distribution circuit 130*a* has four branches, the second magnetic flux distribution circuit 130*b* may also have four branches and a terminal of each of the branches may be disposed adjacent to each other to receive distributed magnetic flux.

The magnetomotive force source 140 may include a coil 144, providing magnetic flux to the first magnetic flux distribution circuit 130*a* and the second magnetic flux distribution circuit 130*b*, and a magnetic core 142 confining magnetic flux generated by the coil 144. The magnetomotive force source 140 may include a magnetic core 142 and a coil 144 surrounding the magnetic core 142. When current flows through the coil 144, the magnetic core 142 focuses a magnetic field to generate magnetic flux. The magnetic flux may not be lost through a closed magnetic circuit when there is no leakage flux through the magnetic circuit.

A cross-sectional area of one end of the magnetic core 142 of the magnetomotive force source 140 may be smaller than or equal to a cross-sectional area of the input end of the first magnetic flux distribution circuit 130*a* to efficiently transfer magnetic flux. Accordingly, one end of the magnetic core 142 may be tapered to decrease a cross-sectional area. A cross-sectional area of the other end of the magnetic core 142 of the magnetomotive force source 140 may be greater than or equal to a cross-sectional area of the output end of the second magnetic flux distribution circuit 130*b* to efficiently receive magnetic flux. Since a direction of the magnetic flux of the magnetomotive force source 140 may be changed, the cross-sectional area of one end of the magnetic core 140 may be equal to the cross-sectional area of the first magnetic contact plug 136*a* and the cross-sectional area of the other end of the magnetic core 140 may be equal to the cross-sectional area of the second magnetic contact plug 136*b*.

Specifically, the magnetomotive force source 140 may include a first magnetic core 142*a* having a tapered shape to provide the magnetic flux to the first contact plug 136*a*, a second magnetic core 142*b* having a tapered shape to provide the magnetic flux to the second contact plug 136*b*, a third magnetic core 142*c* connecting the first magnetic core 142*a* and the second magnetic core 142*b* to each other, and a coil 144 disposed to surround at least one of the first to third magnetic cores 142*a*, 142*b*, and 143*b*. The magnetomotive force source 140 may be separately manufactured, and then adhered to the substrate 122. The magnetic core 142 may have a "[" shape.

Referring to FIG. 1F, a first magnetic flux distribution pattern may have four magnetic paths or branches. However, a magnetic layer 114 printed on an LED device is absent in one magnetic path. In this case, injected magnetic flux may be distributed to another magnetic path due to an increase in magnetic resistance in the magnetic path in which the magnetic layer is absent. Accordingly, selective magnetic transfer may be performed except for an LED, on which a magnetic layer is not formed, in an array of LED devices to be transferred FIGS. 2A to 2H are cross-sectional views illustrating a fabrication method of a first magnetic flux distribution circuit and a second magnetic flux distribution circuit according to an example embodiment of the present disclosure.

Referring to FIGS. 2A to 2H, a fabrication method of a magnetic transfer apparatus may include forming a magnetic layer 138 on a lower surface of a substrate 122, forming first via holes in the substrate 122 and filling the first via holes with a magnetic material to form first magnetic vias 132*a*, forming a first magnetic flux distribution pattern 134*a*, connected to the first magnetic vias 132*a*, on the substrate 122, stacking a first non-magnetic layer 126 on the substrate 122, on which the first magnetic flux distribution pattern 134 is formed, and forming a second via hole to penetrate through the first non-magnetic layer 126 and the substrate 122, and then filling the second via hole with a magnetic material to form second magnetic vias 132*b*, and forming a second magnetic flux distribution pattern 134*b* on the substrate 122 on which the second magnetic vias 132*b* are formed.

The fabrication method of a magnetic transfer apparatus may further include: forming a second non-magnetic layer 126 on the substrate on which the second magnetic flux distribution pattern 134*b* is formed, forming a first magnetic contact plug 136*a* penetrating through the first non-magnetic layer 124 and the second non-magnetic layer 126 and connected to the first magnetic flux distribution pattern 134*a*, and forming a second magnetic contact plug 136*b* penetrating through the second non-magnetic layer 126 and connected to the second magnetic flux distribution pattern 134*b*. The first magnetic flux distribution pattern 134*a* and the second magnetic flux distribution pattern 134*b* may each include a plurality of branches, and lengths of the branches thereof may be the same.

Figure 2A:
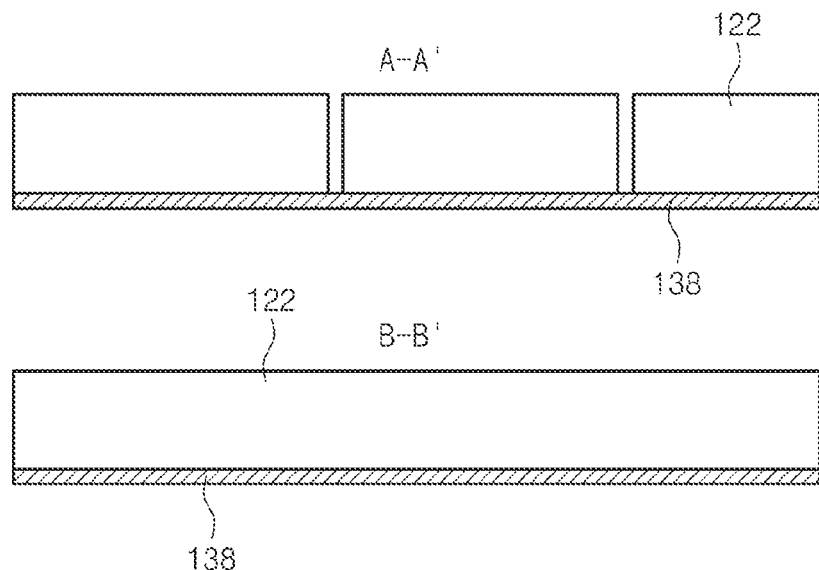
FIGS. 2A to 2H are cross-sectional views illustrating a fabrication method of a first magnetic flux distribution circuit and a second magnetic flux distribution circuit according to an example embodiment of the present disclosure.

Referring to FIG. 2A, a magnetic layer 138 may be formed on a lower surface of a substrate 122. The magnetic layer 138 may be formed by an electroplating process or a deposition process. A first via hole may be formed in the substrate 122. The first via hole may be formed by a laser drilling process or a photolithography and etching process.

Figure 2B:
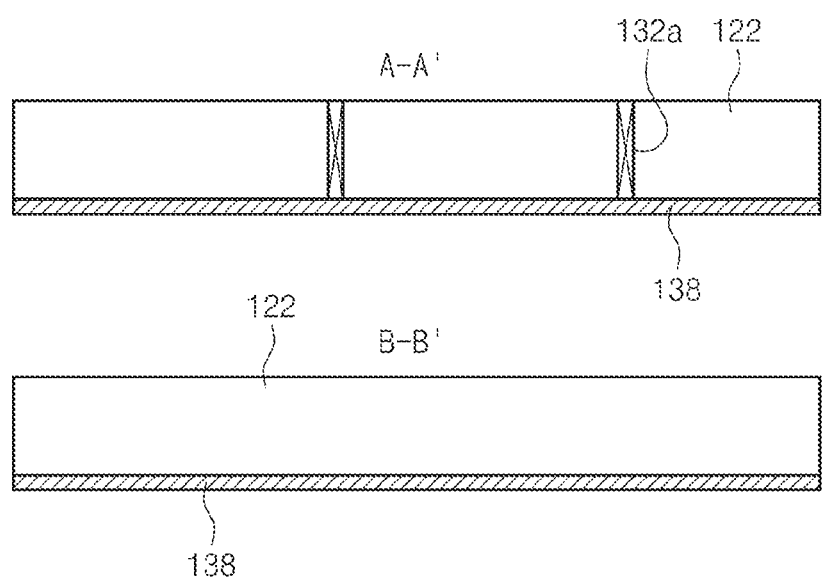

Referring to FIG. 2B, the first via hole may be filled by a vacuum deposition process such as an electroplating process or a sputtering process to form first magnetic vias 132*a*.

Figure 2C:
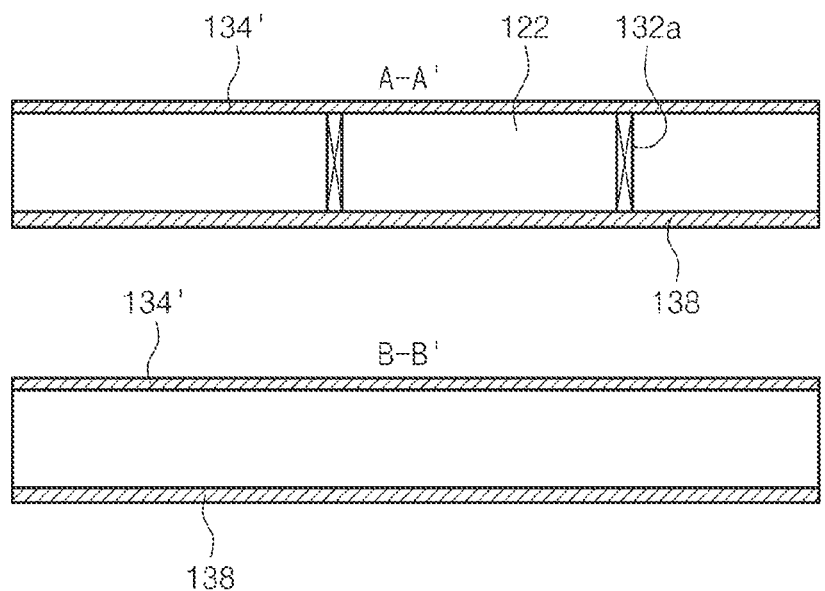
Figure 2D:
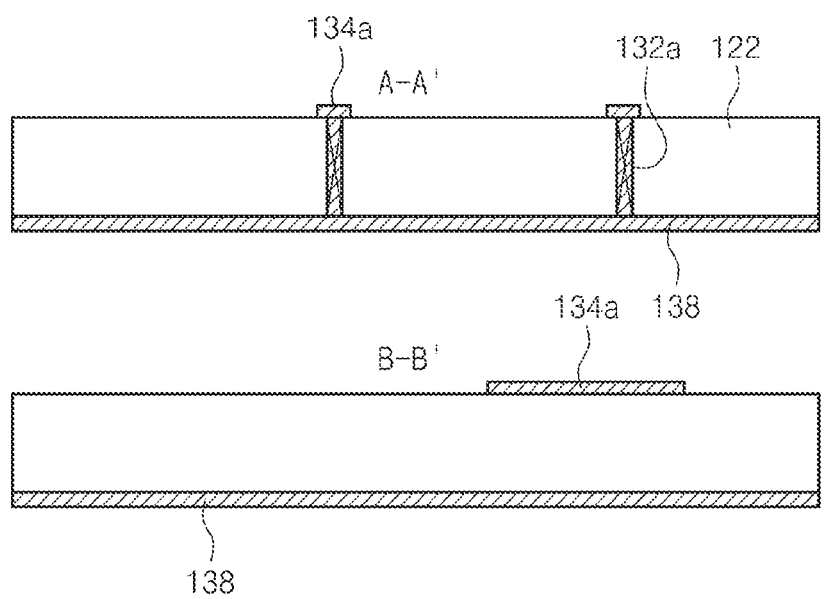

Referring to FIGS. 2C and 2D, a magnetic layer 134' may be formed on the upper surface of the substrate 122. The magnetic layer 134' may be patterned to form a first magnetic flux distribution pattern 134*a*. The first magnetic flux distribution pattern 134*a* may connect the first magnetic vias 132*a* to each other in a binary tree structure.

Figure 2E:
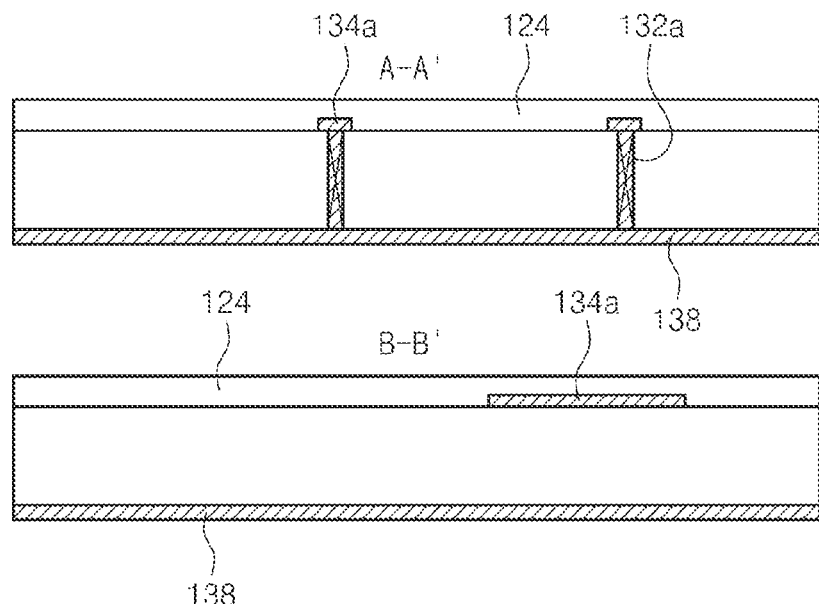
Figure 2F:
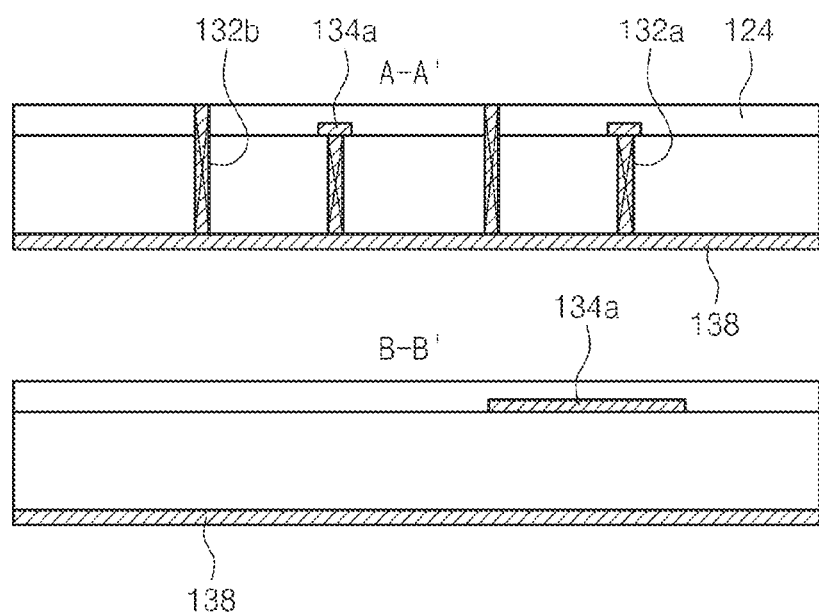

Referring to FIGS. 2E and 2F, a first non-magnetic layer 124 is stacked on the substrate on which the first magnetic flux distribution pattern 134*a* is formed. Second via holes may be formed to penetrate through the first non-magnetic layer 124 and the substrate 122, and may then be filled with a magnetic material to form second magnetic vias 132*b*.

Figure 2G:
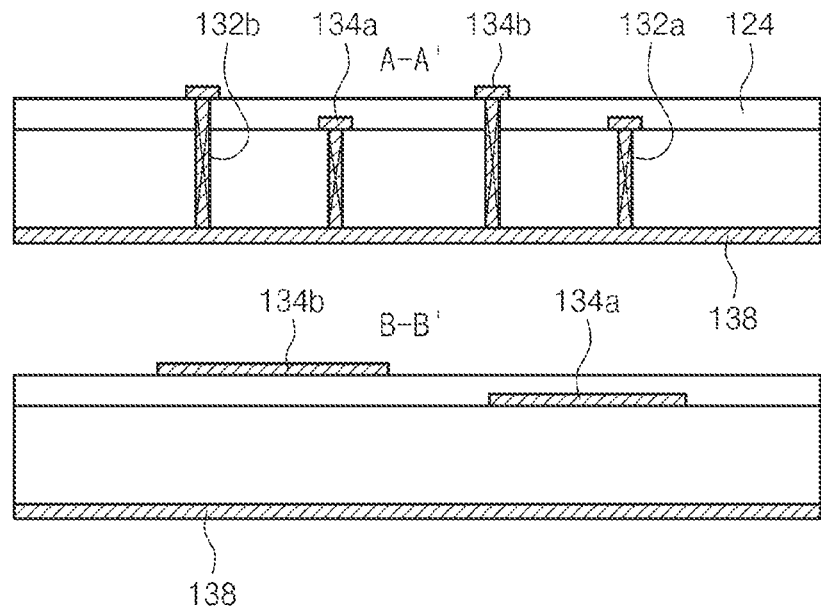

Referring to FIG. 2G, a magnetic layer may be formed on an upper surface of the first non-magnetic layer 124. The magnetic layer may be patterned to form a second magnetic flux distribution pattern 134*b*. The second magnetic flux distribution pattern 134*b* may connect the second magnetic vias 132*b* to each other in a binary tree structure.

Figure 2H:
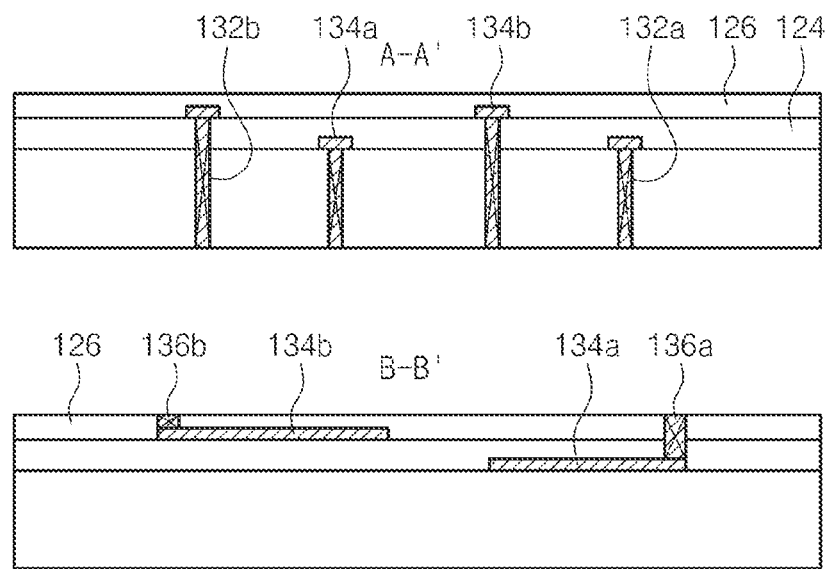

Referring to FIG. 2H, a second non-magnetic layer 126 may be formed on the substrate 122 on which the second magnetic flux distribution pattern 134*b* is formed. A first magnetic contact plug 136*a* may be formed to penetrate through the first non-magnetic layer 124 and the second non-magnetic layer 126 and to be connected to the first magnetic flux distribution pattern 134*a*. A second magnetic contact plug 136*b* may be formed to penetrate through the second non-magnetic layer 126 and to be connected to the second magnetic flux distribution pattern 134*b*. The first magnetic contact plug 136*a* may receive magnetic flux from a magnetomotive force source 140, and the second magnetic contact plug 136*b* may provide the magnetomotive force source 140 with a magnetic flux flowing through a magnetic circuit. The magnetic layer 138, disposed on the lower surface of the substrate 122, may be removed.

The magneto-magnetic element 140 may include a magnetic core 142, having a "[" shape, and a coil 144 surrounding the magnetic core 142. The magnetic core 142 may be separately formed to be manufactured. Opposite ends of the magnetic core 142 may be magnetically coupled to the first magnetic contact plug 136a and the second magnetic contact plug 136b, respectively.

FIGS. 3 to 6 are plan views of magnetic circuits according to example embodiments of the present disclosure.

Figure 3:
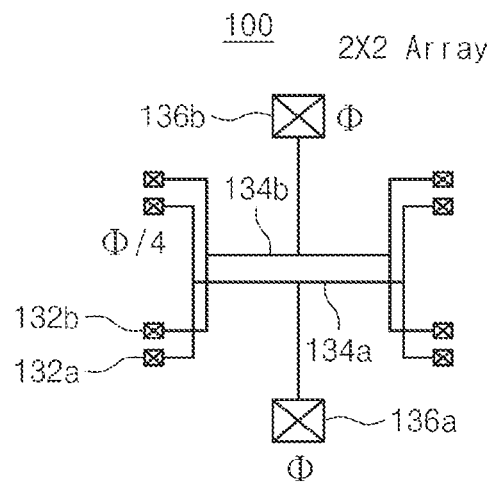
FIGS. 3 to 6 are plan views of magnetic circuits according to example embodiments of the present disclosure.

Referring to FIG. 3, a magnetic transfer apparatus 100 may have a 2-by-2 array structure. A first magnetic flux distribution pattern 134a, constituting a first magnetic flux distribution circuit, is represented by a solid line and a second magnetic flux distribution pattern 134b, constituting a second magnetic flux distribution circuit, may be represented by a dashed line. Magnetic flux incident on a first magnetic contact plug 136a, may be distributed and then recollected to form a closed circuit, and may come out to a second magnetic contact plug 136b.

Figure 4:
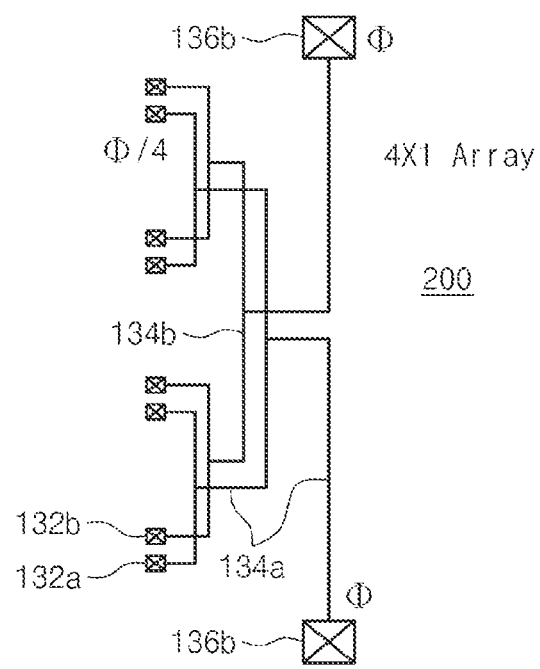

Referring to FIG. 4, a magnetic transfer apparatus 200 may have a 4-by-1 array structure. A first magnetic flux distribution pattern 134a, constituting a first magnetic flux distribution circuit, is represented by a solid line and a second magnetic flux distribution pattern 134b, constituting a second magnetic flux distribution circuit, is indicated by a dashed line. A magnetic flux incident on a first magnetic contact plug 136a, may be distributed and then recollected to form a closed circuit, and may come out to a second magnetic contact plug 136b.

Figure 5:
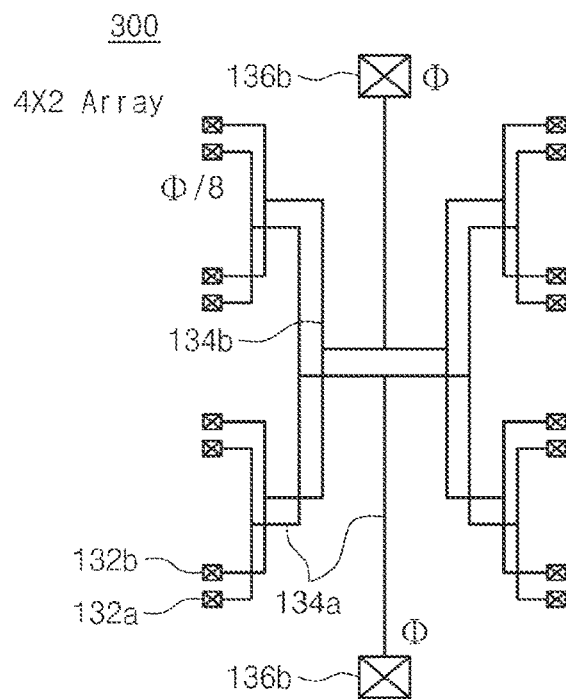

Referring to FIG. 5, a magnetic transfer apparatus 300 may have a 4-by-2 array structure. A first magnetic flux distribution pattern 134a, constituting a first magnetic flux distribution circuit, is represented by a solid line and a second magnetic flux distribution pattern 134b, constituting a second magnetic flux distribution circuit, is represented by a dashed line. Magnetic flux incident on a first magnetic contact plug 136a, may be distributed and then recollected to form a closed circuit, and may come out to a second magnetic contact plug 136b.

Figure 6:
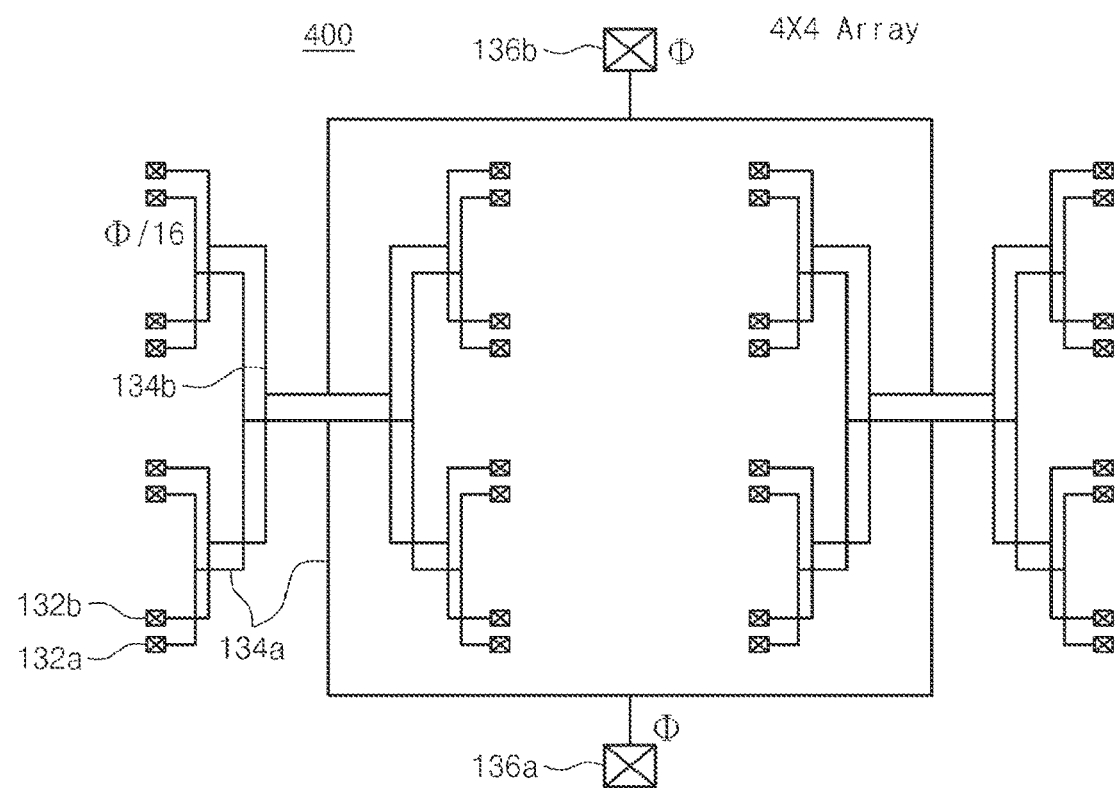

Referring to FIG. 6, a magnetic transfer apparatus 400 may have a 4-by-4 array structure. A first magnetic flux distribution pattern 134a, constituting a first magnetic flux distribution circuit, is represented by a solid line and a second magnetic flux distribution pattern 134b, constituting a second magnetic flux distribution circuit, is represented by a dashed line. Magnetic flux D, incident on a first magnetic contact plug 136a, may be distributed and then recollected to form a closed circuit, and may come out to a second magnetic contact plug 136b.

Figure 7:
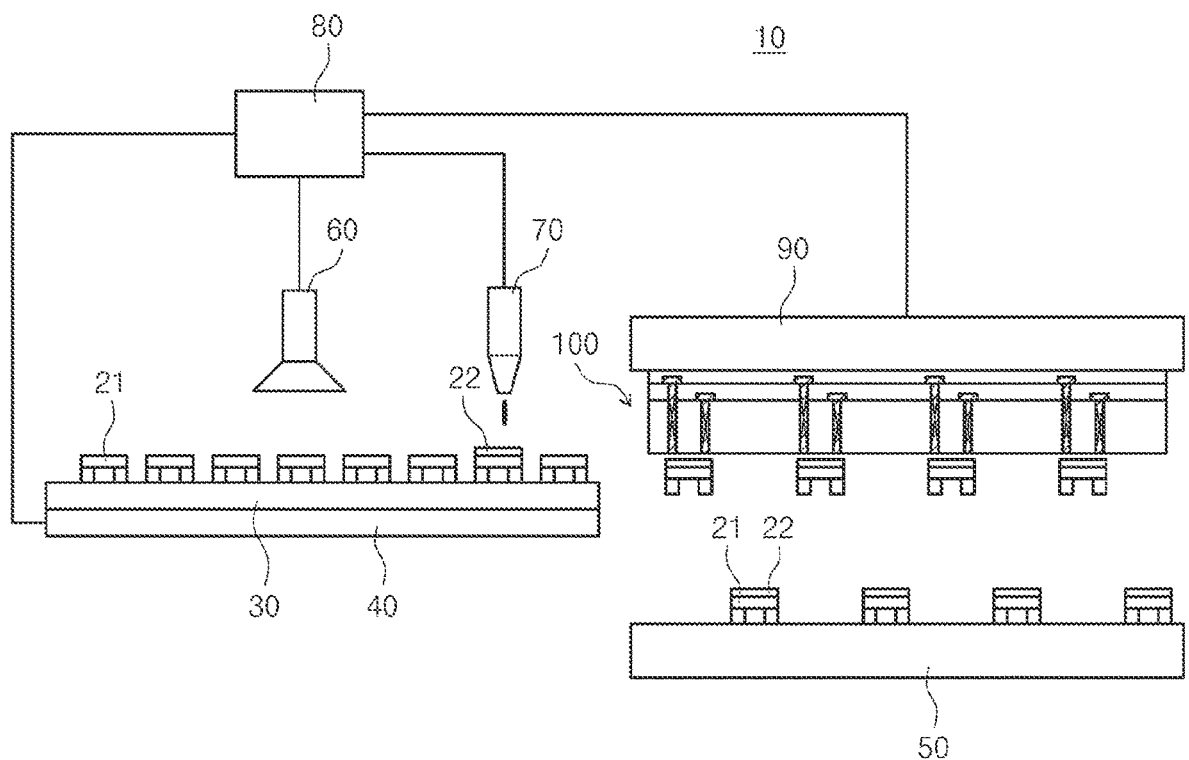
FIG. 7 is a conceptual diagram illustrating an LED device inspection and transfer system according to an example embodiment of the present disclosure.

FIG. 7 is a conceptual diagram illustrating an inspection and transfer system of LED devices according to an example embodiment of the present disclosure.

Referring to FIG. 7, an inspection and transfer system 10 of LED devices may include a control unit 80 transferring LED devices 21 to a vertical conductive temporary substrate 30 and then connecting a probe circuit 40 to the temporary substrate 30 such that the LED devices 21 are inspected to analyze characteristics of the LED devices 21, a magnetic layer printing unit 70 forming a magnetic layer 22 on each of the LED devices 21 based on the analyzed characteristics of the LED devices 21, and a magnetic transfer apparatus 100 transferring the LED devices 21, each including the magnetic layer 21 formed thereon, to a final substrate 50.

The vertical conductive temporary substrate 30 is a temporary substrate having conductivity in a vertical direction, and may be an anisotropic conductive film. Conventionally, the anisotropic conductive film may be bonded while being heated to a predetermined temperature or higher, and then separated while being heated to a predetermined temperature or more.

A plurality of LED devices 21, transferred from a growth substrate, may be disposed on one surface of the temporary substrate 30. A probe circuit 40 may be connected to the other surface of the temporary substrate 30. The probe circuit 40 may include a plurality of probes for electrical connection on a probe substrate.

The probe circuit 40 may provide an electrical connection of each of the LED devices 21 through the temporary substrate 30. Accordingly, characteristics of each of the LED devices may be inspected. Specifically, electrical characteristics (an ideality factor, an I-V curve, and a breakdown voltage) and optical characteristics (EL measurement, wavelength measurement, and S parameter) may be evaluated, and LED devices 21 may be classified based on the characteristics.

An optical measuring device 60 may be used to measure the optical characteristics. The optical measuring device 60 may be a spectroscopic device for measuring light-emitting characteristics or a microscope for measuring a shape and optical characteristics.

The control unit 80 may control the probe circuit 40 to analyze and store position-dependent characteristics of the LED devices 21. Also, the control unit 40 may control the magnetic layer printing unit 70 based on the analyzed characteristics. For example, the control unit 40 may control the magnetic layer printing unit 70 such that the magnetic layer 22 is not coated on an LED device in a bad state. The magnetic layer printing unit 70 may include a transportation means and may coat a magnetic layer on good LED devices, other than LED devices in a bad state. The magnetic layer printing unit 70 may print a magnetic ink, containing magnetic particles, to form the magnetic layer 22. Also, the controller 80 may control the magnetic transfer apparatus 100 to pick up predetermined LED devices.

The magnetic transfer apparatus 100 may include a magnetomotive force source providing magnetic flux, a first magnetic flux distribution circuit connected to one end of the magnetomotive force source, having a single input terminal and a plurality of output terminals, and distributing magnetic flux, and a second magnetic flux distribution circuit connected to the other end of the magnetomotive force source, having a single output terminal and a plurality of input terminals, and collecting the distributed magnetic flux. The output terminals of the first magnetic flux distribution circuit may be disposed adjacent to each other to form a pair with the input terminals of the second magnetic flux distribution circuit.

The magnetic transfer apparatus 100 may be moved to the temporary substrate 21 by a transportation means 90, and may then pick up selected LED devices 21 and transfer the picked-up LED devices 21 to a final substrate 50. The final substrate 50 may include TFT devices arranged to select arranged LED devices.

According to a modified embodiment, the control unit 80 may control a magnetic layer printing unit 70 to form a magnetic layer 22 on all LED devices. The control unit 80 may control and cut off a predetermined magnetic path to selectively pick up only predetermined LED devices, based on analyzed characteristics. To this end, the magnetic transfer apparatus 100 may perform a selective transfer process.

FIGS. 8A to 8G are cross-sectional views illustrating an inspection and transfer method of LED devices according to an example embodiment of the present disclosure.

Referring to FIGS. 8A to 8G, an inspection and transfer method of LED devices may include manufacturing LED devices 21 on a growth substrate 20 and then attaching a vertical conductive temporary substrate 30 to the LED devices 21; separating the growth substrate 20 and the LED devices 21 from each other and transferring the separated LED devices 21 to the vertical conductive temporary substrate 30; connecting a probe circuit 40 to the temporary substrate 30 to inspect the LED devices 21 such that the LED devices 21 are classified based on characteristics of the LED devices 21; forming a magnetic layer 22 on each of the LED devices 21; and transferring the LED devices 21, each including the magnetic layer 22 formed thereon, to a final substrate 50 using a magnetic transfer apparatus 100.

Figure 8A:
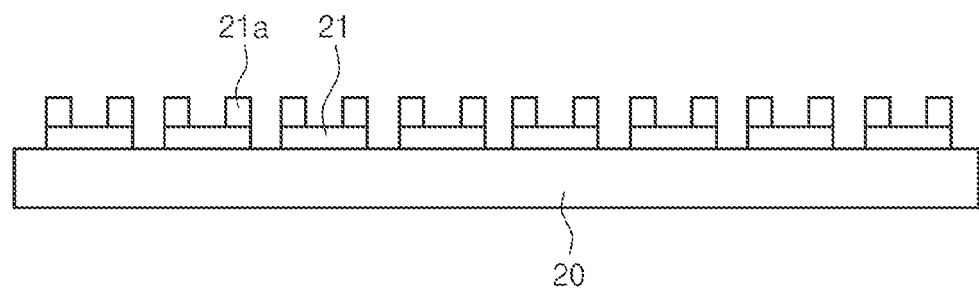
FIGS. 8A to 8G are cross-sectional views illustrating an LED device inspection and transfer method according to an example embodiment of the present disclosure.
Figure 8B:
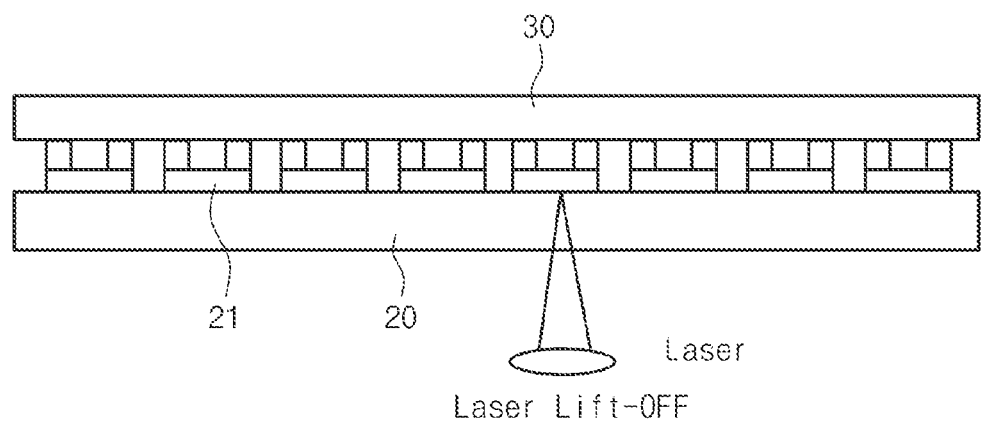

Referring to FIGS. 8A and 8B, LED devices 21 may be manufactured on a growth substrate 20, and a vertical conductive temporary substrate 21 may then be attached to the LED devices 21. The growth substrate 20 may be a sapphire substrate, a silicon (Si) substrate, or a gallium-arsenic (GaAs) substrate. The LED devices 21 may include a red LED, a green LED, or a blue LED. The LED devices 21 may include connection pads 21a for electrical connection.

The LED devices 21 may be transferred to a vertical conductive temporary substrate 30. The vertical conductive temporary substrate 30 may be in the form of a film or a tape. The vertical conductive temporary substrate 30 may include a material having electrical conductivity in a vertical direction. The vertical conductive temporary substrate 30 may be heated to a predetermined temperature to be attached to the LED devices 21.

Figure 8C:
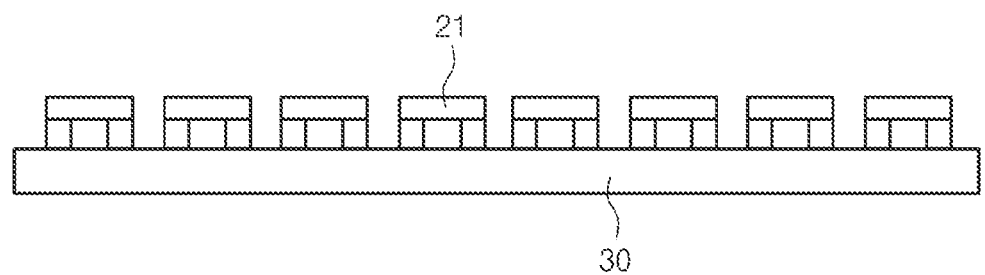

Referring to FIG. 8C, the growth substrate 20 and the LED devices 21 may be separated from each other, and the separated LED devices 21 may be transferred to the vertical conductive temporary substrate 30.

A laser lift-off process may be performed to separate the LED devices 21 from the growth substrate 20. For example, laser beam may be irradiated through a transparent sapphire substrate to separate a gallium nitride (GaN) thin film from the sapphire substrate.

Accordingly, the growth substrate 20 may be divided into LED devices, and the LED devices may be transferred to the temporary substrate 30.

Figure 8D:
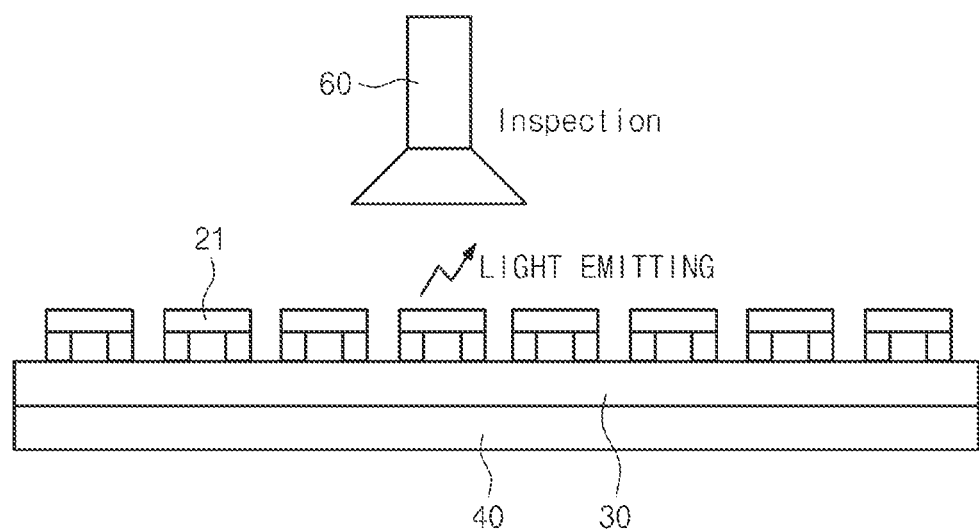

Referring to FIG. 8D, a probe circuit 40 may be connected to the temporary substrate 30 to inspect the LED devices 21, so that the LED devices 21 may be classified based on characteristics of the LED devices 21. The probe circuit 40 may provide an electrical connection of each of the LED devices 21 through the temporary substrate 30. Accordingly, the characteristics of each of the LED devices 21 may be inspected.

Figure 8E:
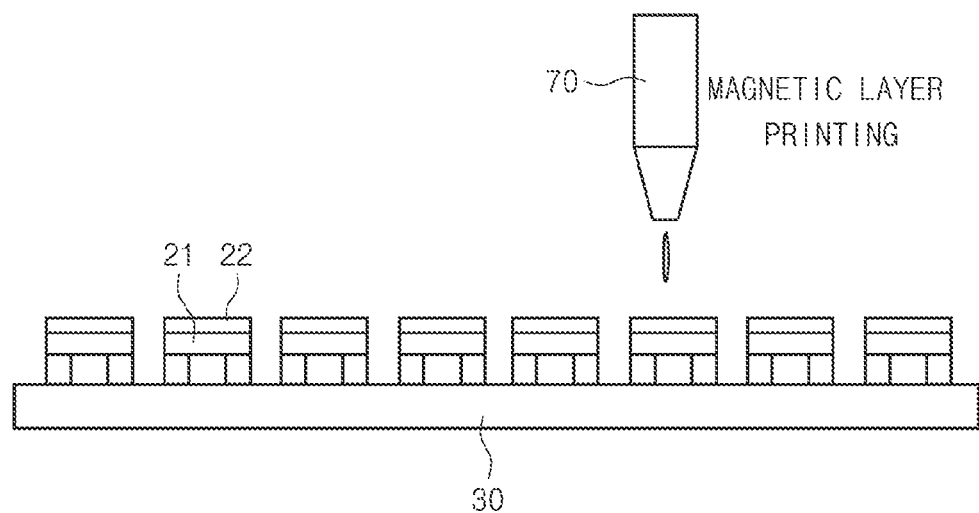

Referring to FIG. 8E, the forming of the magnetic layer 22 on each of the LED devices 21 may include forming the magnetic layer 22 on LED devices 21 satisfying predetermined characteristics. The predetermined characteristic may be classified based on the inspected characteristics of the LED devices 21.

According to a modified embodiment, the forming of the magnetic layer on each of the LED devices 21 may include forming the magnetic layer 22 on all the LED devices. The transferring of the LED devices 21, each including the magnetic layer 22 formed thereon, to the final substrate 50 using the magnetic transfer apparatus 100, may include cut off a specific magnetic path of the magnetic transfer apparatuses 100 or 100a to pick up LED devices satisfying predetermined characteristics.

Figure 8F:
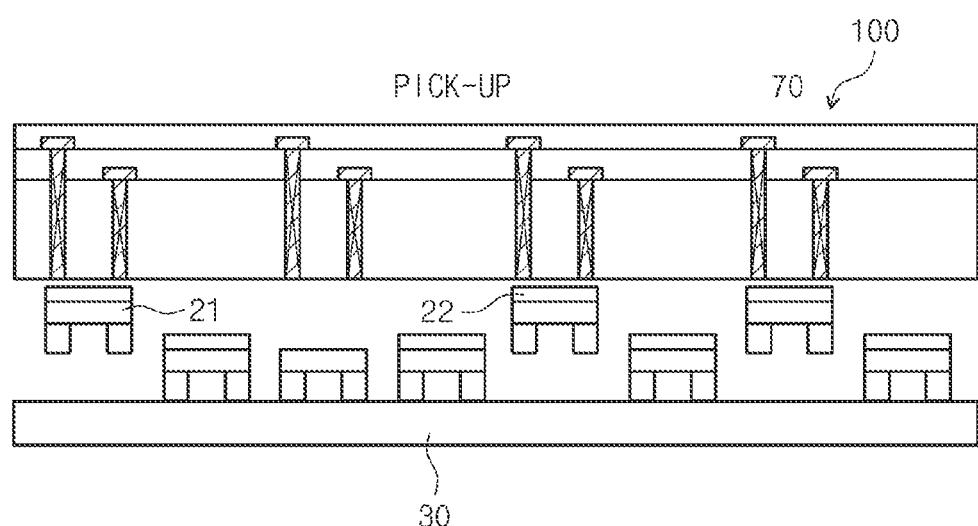
Figure 8G:
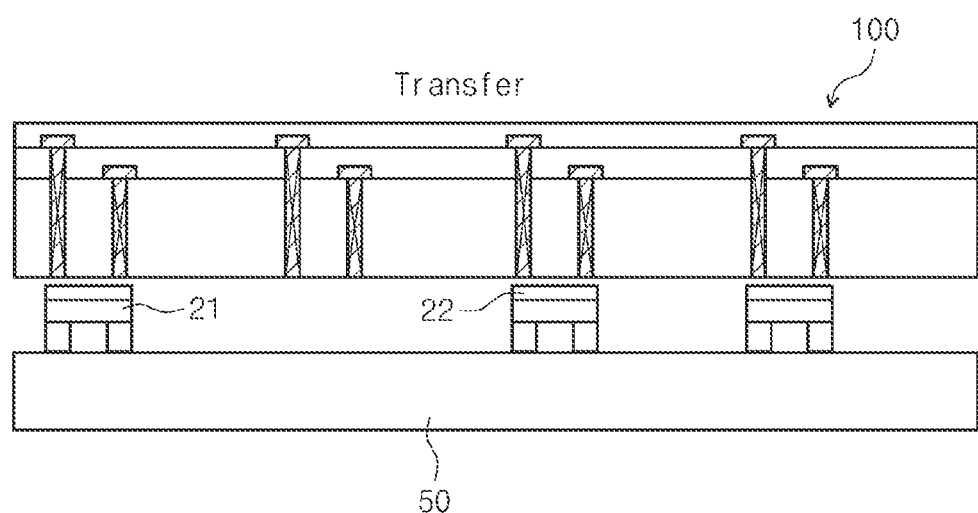

Referring to FIGS. 8F and 8G, the LED devices 21, each including the magnetic layer 22 formed thereon, may be transferred to the final substrate 50 using the magnetic transfer apparatuses 100 or 100a. The temporary substrate 30 may be heated to a predetermined temperature to remove the LED devices 21 from the temporary substrate 30.

The final substrate 50 may be a glass substrate, a polyimide substrate, or a printed circuit board. The final substrate 50 may include a thin film transistor for addressing the LED cells.

After blue LED devices are transferred to the final substrate 50, red LED devices and green LED devices may be transferred to be adjacent to blue LED devices. Bonding of the transferred LED devices of the final substrate 50 may be achieved through eutectic bonding, an anisotropic conductive film, or an anisotropic conductive paste.

Figure 9A:
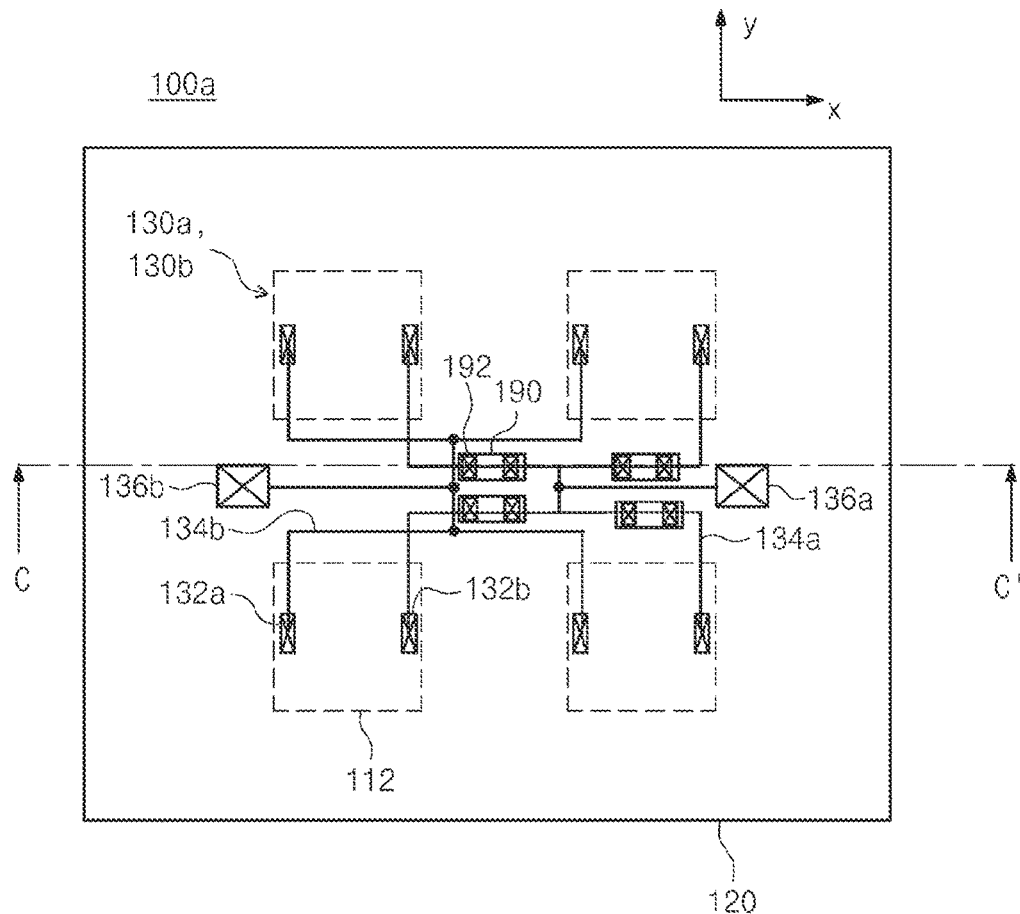
FIG. 9A is a plan view illustrating a magnetic transfer apparatus according to another example embodiment of the present disclosure.

FIG. 9A is a plan view illustrating a magnetic transfer apparatus according to another example embodiment of the present disclosure.

Figure 9B:
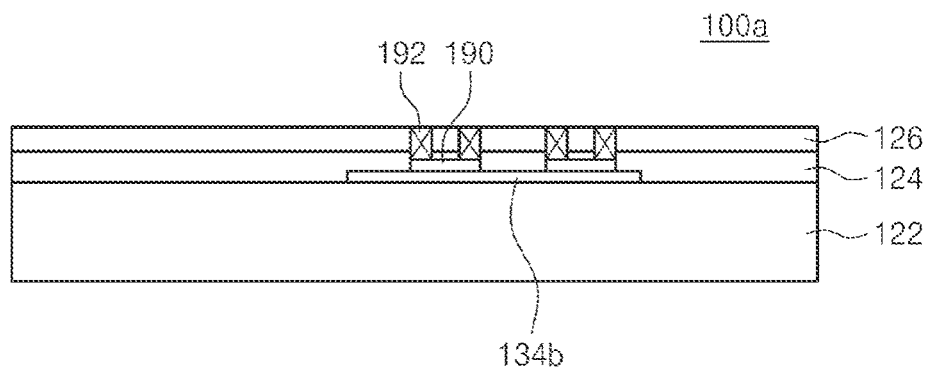
FIG. 9B is a cross-sectional view taken along line C-C' of FIG. 9A.

FIG. 9B is a cross-sectional view taken along line C-C' of FIG. 9A.

Figure 9C:
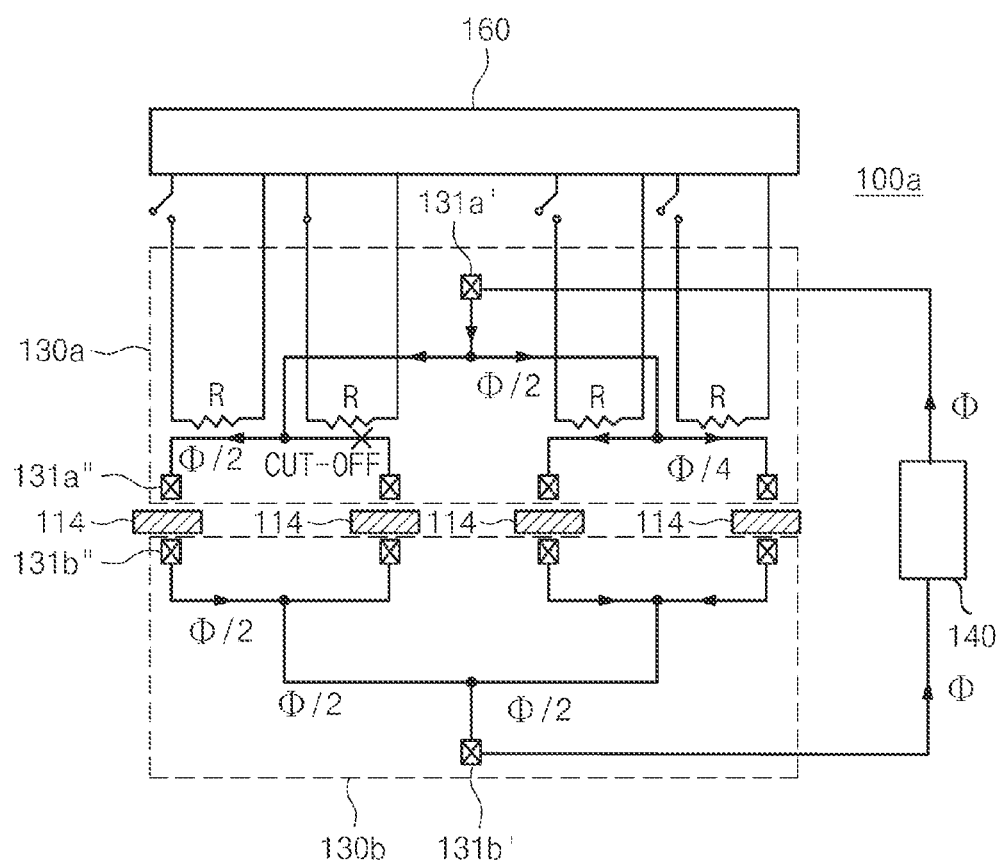
FIG. 9C is a magnetic circuit diagram illustrating the magnetic transfer apparatus of FIG. 9A.

FIG. 9C is a magnetic circuit diagram illustrating the magnetic transfer apparatus of FIG. 9A.

Referring to FIGS. 9A to 9C, a magnetic transfer apparatus 100a according to an example embodiment may include a magnetomotive force source 140 providing a magnetic flux D, a first magnetic flux distribution circuit 130a connected to one end of the magnetomotive force source 140, having a single input terminal 131a' and a plurality of output terminals 131a", and distributing magnetic flux D, and a second magnetic flux distribution circuit 130b connected to the other end of the magnetomotive force source 140, having a single output terminal 131b' and a plurality of input terminals 131b", and collecting distributed magnetic flux Φ/4. The output terminals 131a" of the first magnetic flux distribution circuit 130a may be disposed adjacent to each other to form a pair with the input terminals 130b" of the second magnetic flux distribution circuit 130b. A distance between the output terminals 131a" of the first magnetic flux distribution circuit 130a and the input terminals 130b" of the second magnetic flux distribution circuit 130b, forming a pair with each other, may be smaller than a size of an LED device.

At least one resistance element R may be disposed adjacent to the first magnetic flux distribution circuit 130a and the second magnetic flux distribution circuit 130b. The resistance element R may locally heat the first magnetic flux distribution circuit 130a or the second magnetic flux distribution circuit 130b to cut off a predetermined magnetic path.

The first magnetic flux distribution circuit 130a may include a first magnetic flux distribution pattern 134a having a binary tree structure. The second magnetic flux distribution circuit 130b may include a second magnetic flux distribution pattern 134b having a binary tree structure. The resistance element R may include a resistance pattern 190. A pair of conductive contact plugs 192 may penetrate through a first non-magnetic layer 124 and a second non-magnetic layer 126 to be formed on opposite ends of the resistance pattern 190, respectively.

The resistance elements R may be connected to a heating circuit 160 to receive current. The heating circuit 160 may supply the current to only a selected resistance element through a switch to cut off a magnetic path.

Specifically, four resistance patterns 190 may be disposed on the first magnetic flux distribution pattern 134a. When current is applied to a predetermined resistance pattern 190 through a conductive contact plug 192, the resistance pattern 190 may be heated. Thus, a predetermined magnetic path of a first magnetic flux pattern, extending below the resistance pattern, may be heated to lose magnetic properties to cut off a magnetic path. Accordingly, magnetic flux may not flow through the cut-off magnetic path, so that no magnetic suction force may be generated. As a result, the LED device may not be picked up and transferred.

As described above, a magnetic transfer apparatus according to an example embodiment may uniformly distribute magnetic flux of a single magnetomotive force source in parallel through branches or a magnetic flux distribution circuit, and may then recollect the magnetic flux to provide the same magnetic suction force for each branch to simultaneously pick up a plurality of LED devices.

Although the present disclosure and its advantages have been described in detail, it should be understood that various changes, substitutions and alterations can be made herein without departing from the spirit and scope of the disclosure as defined by the following claims.

What is claimed is:

1. A magnetic transfer apparatus comprising:
a magnetomotive force source providing magnetic flux;
a first magnetic flux distribution circuit connected to one end of the magnetomotive force source, having a single input terminal and a plurality of output terminals, and distributing the magnetic flux; and
a second magnetic flux distribution circuit connected to the other end of the magnetomotive force source, having a single output terminal and a plurality of input terminals, and collecting the distributed magnetic flux,
wherein the output terminals of the first magnetic flux distribution circuit are disposed to be adjacent to each other to form a pair with the input terminals of the second magnetic flux distribution circuit.

2. The magnetic transfer apparatus as set forth in claim 1, wherein a magnetic layer of an LED device is disposed between the output terminal of the first magnetic flux distribution circuit and the input terminal of the second magnetic flux distribution circuit forming a pair with each other, and
the magnetomotive force source, the first magnetic flux distribution circuit, and the second magnetic flux distribution circuit constitute a closed magnetic circuit.

3. The magnetic transfer apparatus as set forth in claim 1, wherein the first magnetic flux distribution circuit has a binary tree structure such that magnetic paths between the input terminal of the first magnetic flux distribution circuit and the plurality of output terminals of the first magnetic flux distribution circuit have the same magnetic resistance, and
the second magnetic flux distribution circuit has a binary tree structure such that magnetic paths between the plurality of input terminals of the second magnetic flux distribution circuit and the output terminal of the second magnetic flux distribution circuit have the same magnetic resistance.

4. The magnetic transfer apparatus as set forth in claim 1, wherein the first magnetic flux distribution circuit and the second magnetic flux distribution circuit comprise:
a substrate;
a first non-magnetic layer disposed on the substrate;
a second non-magnetic layer disposed on the first non-magnetic layer;
first magnetic vias penetrating through the substrate;
second magnetic vias penetrating through the substrate and the first non-magnetic layer;
a first magnetic flux distribution pattern disposed on the substrate and connecting the first magnetic vias to each other;
a second magnetic flux distribution pattern disposed on the first non-magnetic layer and connecting the second magnetic vias to each other;
a first magnetic contact plug disposed to penetrate through the first non-magnetic layer and the second non-magnetic layer and magnetically connected to the first magnetic flux distribution pattern; and
a second magnetic contact plug disposed to penetrate through the second non-magnetic layer and magnetically connected to the second magnetic flux distribution pattern, and
wherein the first magnetic vias and the second magnetic vias are disposed adjacent to each other to form a pair,
the first magnetic contact plug is connected to one end of the magnetomotive force source,
the second magnetic contact plug is connected to the other end of the magnetomotive force source,
the input terminal of the first magnetic flux distribution circuit corresponds to the first magnetic contact plug,
the output terminals of the first magnetic flux distribution circuit corresponds to the first magnetic vias,
the output terminal of the second magnetic flux distribution circuit corresponds to the second magnetic contact plug, and
the input terminals of the second magnetic flux distribution circuit correspond to the second magnetic vias.

5. The magnetic transfer apparatus as set forth in claim 1, wherein the magnetomotive force source comprises:
a coil providing magnetic flux to the first magnetic flux distribution circuit and the second magnetic flux distribution circuit; and
a magnetic core confining magnetic flux generated by the coil.

6. The magnetic transfer apparatus as set forth in claim 4, wherein the magnetomotive force source comprises:
a first magnetic core having a tapered shape to provide the magnetic flux to the first contact plug;
a second magnetic core having a tapered shape to provide the magnetic flux to the second contact plug;
a third magnetic core connecting the first magnetic core and the second magnetic core to each other; and
a coil disposed to surround at least one of the first to third magnetic cores.

7. The magnetic transfer apparatus as set forth in claim 1, wherein at least one resistance element is provided to be adjacent to the first magnetic flux distribution circuit and the second magnetic flux distribution circuit, and
the at least one resistance element locally heats the first magnetic flux distribution circuit or the second magnetic flux distribution circuit to cut off a predetermined magnetic path.

* * * * *